United States Patent

Wilkens et al.

[15] 3,670,215

[45] June 13, 1972

[54] HEAT DISSIPATOR FOR INTEGRATED CIRCUIT

[72] Inventors: Seymour Wilkens, Wantagh; Edmund G. Trunk, East Meadow, both of N.Y.

[73] Assignee: The Staver Company, Incorporated, Bay Shore, L.I., N.Y.

[22] Filed: Sept. 28, 1970

[21] Appl. No.: 76,035

[52] U.S. Cl. ....................317/234 R, 317/234 A, 317/234 E, 317/234 G, 317/234 P, 317/235, 174/15, 165/80

[51] Int. Cl. ..........................................H01l 3/00, H01l 5/00

[58] Field of Search .................317/234, 235, 1, 3, 6; 174/15, 174/35, 35.5; 165/80, 185

[56] References Cited

UNITED STATES PATENTS

| | | | |
|---|---|---|---|
| 2,694,554 | 11/1954 | Lemeshka | 165/80 X |
| 3,412,788 | 11/1968 | Pomerantz | 317/234 |
| 3,548,927 | 12/1970 | Spurling | 317/234 X |
| 3,566,958 | 3/1971 | Zelina | 317/234 X |

OTHER PUBLICATIONS

IBM Technical Disclosure Bulletin, Snap-On Heat Exchanger, by Mulligan, Vol. 10, No. 8, January 1968 page 1242.

*Primary Examiner*—John W. Huckert
*Assistant Examiner*—Andrew J. James
*Attorney*—James and Franklin

[57] ABSTRACT

A heat dissipator for a semiconductor component of the type having L-shaped heat conductive tabs extending therefrom comprising a stamped sheet metal body having two pairs of oppositely facing fingers struck from said sheet metal body and bent out of the plane thereof. One of said pairs of fingers functions as resilient snap means adapted to holdingly receive the body of the semiconductor device. The other pair of fingers are L-shaped to correspond with the shape of said heat conductive tabs and are adapted to snugly engage oppositely facing surfaces thereof in planar heat conductive relationship. The dissipator body has two wing portions extending in diverging relationship in a generally opposite direction from said two pairs of fingers.

24 Claims, 6 Drawing Figures

INVENTOR
SEYMOUR WILENS
EDMUND G. TRUNK
BY James and Franklin
ATTORNEY

HEAT DISSIPATOR FOR INTEGRATED CIRCUIT

This invention relates to heat dissipators for electronic devices and in particular for use with semiconductors.

Semiconductor devices are today being used at an ever increasing rate. Semiconductor components such as integrated circuits are small in size but are often designed to handle large amounts of power. One of the primary problems associated with such high power semiconductor circuitry is the dissipation of the relatively large amounts of heat that they generate. This has led to the use of heat dissipators, often referred to as heatsinks. In order to achieve thermal stability heatsinks employed in the past have been so large and heavy that they sometimes offset the space and weight advantages gained by the use of semiconductors.

Integrated circuits of the type here under consideration are generally fabricated on a single chip of semiconductor material, external leads being soldered or otherwise attached in electrically conductive relationship to specific points in the circuit. A recently developed fabrication technique utilizes a silicon substrate deposited on one surface of an elongated metallic strip. Several monolithic integrated circuits may be fabricated in this manner in spaced relationship along a single metallic strip, the strip being subsequently severed between consecutive devices. The substrate in then encased in a dielectric casing molded therearound, the metallic strip extending through the casing at opposite sides thereof and being adapted to function as heat conductive tabs. The casing may be plastic or ceramic or any other suitable dielectric material. No metal housing is needed or used. The body is generally rectangular in shape, and a plurality of external metallic leads generally extend from the casing.

In the past, the mounting of such semiconductor devices on a heatsink structure has presented difficulties. Commonly the heatsink is attached to the device by soldering or the like. This method involves considerable time and expensive equipment and in some cases the heatsink cannot be re-used if the device is found to be defective and replaced.

In the case of plastic-encased semiconductor devices having an exposed metallic surface, physical attachment to the heatsink presents additional problems. Thus, if a screw is used, a torque limiting tool may be required to insure that the screw is tight enough to prevent shifting and loosening but not so tight as to chip or break the plastic casing. Moreover, whether or not a screw is used, the particular mounting arrangement must be carefully planned in accordance with the specific layout and space requirements of the final circuit.

The primary object of the present invention is generally to provide an improved heat dissipator for a semiconductor device.

More particularly it is an object of the present invention to provide heat dissipators which are light in weight, compact in dimension and low in cost.

It is yet another object of the present invention to provide a heat dissipator adapted for use with a plastic encased semiconductor component having heat conductive tabs extending therefrom, said dissipator being adapted to provide excellent heat conductive engagement with the tabs.

It is a further object of the present invention to provide a heat dissipator of the type described for use with semiconductor devices wherein the device may be firmly and removably attached to the dissipator in a good heat conductive relationship in a simple expedient manner without the use of tools.

To these ends the heat dissipator of the present invention comprises a stamped sheet metal body having a base portion and two wing portions extending therefrom in diverging relationship. Two pairs of oppositely facing fingers are struck from the metallic sheet and bent upwardly in a direction generally opposite to the extension of said wing portions. The semiconductor body is adapted to be snapped into place adjacent the base portion of the dissipator between one pair of said fingers which function as resilient snap means. In this position the other pair of fingers follow the contour of the oppositely extending heat conductive tabs which are accordingly disposed between said fingers in surface-to-surface heat conductive engagement therewith. The two wing portions are provided with a plurality of excised and displaced strips to provide for improved convective heat dissipation.

To the accomplishment of the above and to such other objects as may hereinafter appear, the present invention relates to a heat dissipator for a semiconductor device as defined in the appended claims and as described in this specification taken together with the accompanying drawings, in which:

Figure 1:
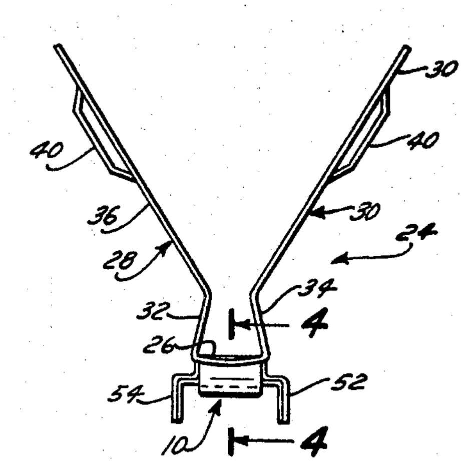
FIG. 1 is a side elevational view of the dissipator of the present invention shown in operative engagement with a plastic-encased integrated circuit (hereinafter referred to as a plastic pack)

Referring to the drawings, and more particularly to FIGS. 1 through 5, there is illustrated a semiconductor device generally designated 10 having a plastic encased body 12 and four wire leads 14 extending from opposite sides thereof. In the case illustrated, device 10 is a monolithic semiconductor integrated circuit, leads 14 being electrically connected to selected points on the circuit. It will be appreciated, however, that device 10 may be any encased semiconductor device with any number of external leads extending from the casing 12. The body 12 is rectangular and quite small, typically three-fourths inch long, three-eighths inch wide and one-fourth inch thick. Nevertheless, it is capable of handling large amounts of power.

Figure 4:
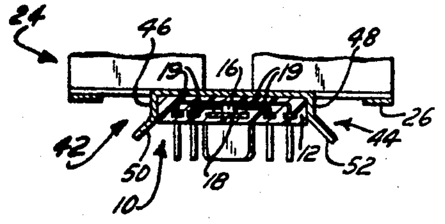
FIG. 4 is a fragmented cross-sectional view taken along the line 4—4 of FIG. 1.
Figure 5:
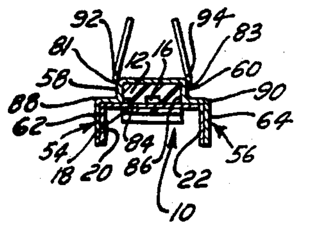
FIG. 5 is a fragmented cross-sectional view taken along the line 5—5 of FIG. 2.

As best illustrated in FIGS. 4 and 5 the circuit is formed on a small chip of semiconductor material 16 disposed on a metallic strip 18, the connections between external leads 14 and chip 16 being illustrated schematically by lead lines 19 (FIG. 4). The metallic strip 18 extends through the plastic casing 12 at opposite sides thereof and both extended portions are bent downwardly as shown in FIG. 5 to form two L-shaped heatsink tabs 20 and 22. Tabs 20 and 22 are intended to be cooled to maintain device operation below the maximum allowable junction temperature.

As best shown in FIGS. 1 through 4 the heat dissipator of the present invention comprises a stamped sheet metal unit generally designated 24. It has a base 26 and two wings generally designated 28 and 30. Wings 28 and 30 are preferably slightly convergent for a small distance adjacent the base at 32 and 34 and then diverge at an angle of approximately 30° to the vertical at 36 and 38. The larger area divergent portions 36 and 38 are provided with a plurality of parallel strips 40 excised and displaced outwardly from the plane of the sheet for increased convective heat dissipation.

Figure 2:
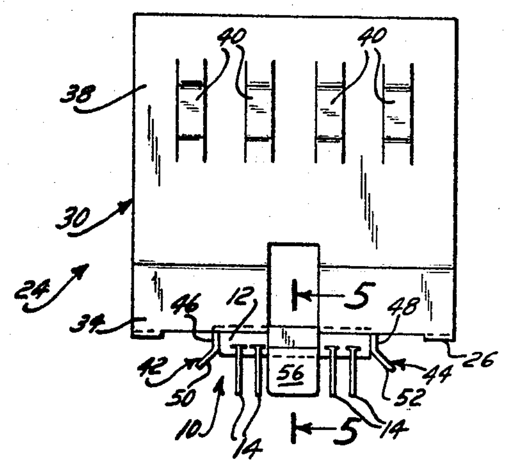
FIG. 2 is a front elevational view of the dissipator and plastic pack of FIG. 1.
Figure 3:
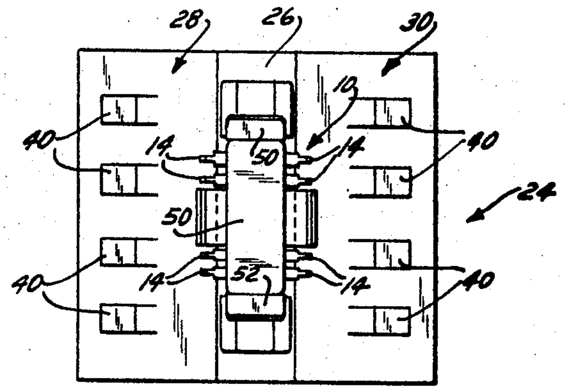
FIG. 3 is a bottom plan view of the dissipator and plastic pack of FIG. 1.

As best shown in FIGS. 2 and 3, two pairs of oppositely facing fingers are cut out from the sheet metal body and bent generally downwardly from base 26. The first pair of fingers generally designated 42 and 44 are struck entirely from the base 26 and are adapted to function as resilient snap members adapted to removably receive the encased semiconductor body 12. To this end, fingers 42 and 44 immediately extend from base 26 in slightly converging relationship at 46 and 48 and at their lower free ends are bent slopingly outwardly to provide guide tabs 50 and 52 to facilitate insertion of semiconductor body 12. The second pair of fingers 54 and 56 are struck from wings 28 and 30 respectively and extend downwardly from base 26 in planes generally perpendicular to that of fingers 46 and 48. As best shown in FIG. 5 fingers 54 and 56 extend downwardly at 58 and 60 spaced a distance corresponding to the width of semiconductor body 12 and are then bent first outwardly and then inwardly to form L-shaped portions 62 and 64 adapted to snugly receive L-shaped heat-sink tabs 20 and 22, respectively, therebetween in surface-to-surface heat conductive relationship. As best seen in FIGS. 2 and 3 two external leads 14 emanate from body 12 at either side of fingers 54 and 56 and are likewise bent downwardly for easy insertion into a print circuit board.

Considering the dissipator in greater detail, the base 26 is preferably rectangular and wings 28 and 30 are preferably square and have substantially the same width as base 26.

Although the device is not limited to particular dimensions, in a preferred example now being made the base 26 is 1 ½ by ⅝ inch and the wings are 1 ½ inch square. The sheet metal has a thickness of 0.03 inch, but the same unit may be satisfactorily manufactured from sheets of different thicknesses. The excised strips 40 are displaced from the wings a distance of approximately 0.10 inch. The material is preferably beryllium copper but may be any other metallic material having good heat conductive properties, such as aluminum. The metallic sheet may be anodized or coated with black paint having a dull or matte finish in order to improve heat conduction but this is normally left to the user.

Figure 6:
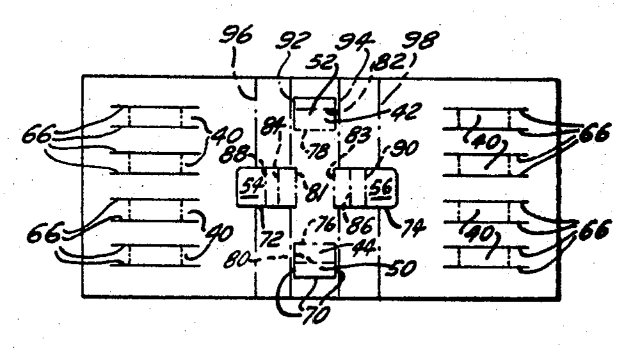
FIG. 6 is a plan view of the sheet metal blank used to fabricate the heat dissipator of the present invention.

It will be apparent that the dissipator of FIGS. 1 through 4 may be conveniently fabricated from a single rectangular piece of sheet metal as illustrated in FIG. 6. As there shown parallel cut lines 66 represent the edges of excised strips 40, cut lines 68 and 70 representing the outline of fingers 42 and 44, respectively, and cut lines 72 and 74 representing the outlines of fingers 54 and 56 respectively.

In order to form the dissipator of FIG. 1 fingers 42 and 44 are bent downwardly out of the plane of the sheet along bend lines 76 and 78 respectively and then outwardly in diverging relationship along bend lines 80 and 82 respectively to form guide tabs 50 and 52. Fingers 54 and 56 are also bent downwardly from the plane of the sheet along lines 81 and 83 and are then bent into the configuration shown in cross section in FIG. 5 along bend lines 84, 86, and 88, 90, respectively. Finally, the two wing portions 28 and 30 are bent upwardly along lines 92 and 94, respectively, and then divergingly outwardly along lines 96 and 98, respectively, strips 40 being excised and displaced from the wing portions as illustrated in FIG. 1.

After insertion within the heat dissipator by means of resilient snap fingers 42 and 44, the semiconductor device is adapted to be electrically connected on a printed circuit board. For this purpose the circuit board is generally provided with a series of holes adapted to receive leads 14 which are secured to the underside of the circuit board in proper electrical connection by flow soldering or the like. The circuit board preferably also is provided with slots adapted to receive fingers 54 and 56 and heatsink tabs 20 and 22 to provide increased stabilization of the entire unit thereon.

The semiconductor body is normally retained in operative engagement with the heatsink by means of resilient snap fingers 42 and 44. In some cases, however, it may be desired to permanently attach heatsink tabs 20 and 22 to fingers 54 and 56 of the dissipator unit, thereby to more reliably retain the body 12 on the heatsink unit 24 and to provide increased conductive heat dissipation from the heatsink tabs to the dissipator unit. To these ends, tabs 20 and 22 may be soldered to fingers 54 and 56 respectively after the semiconductor device is snapped into the dissipator unit. In such a case, however, it is difficult to remove the semiconductor device from the dissipator unit in the event it must be replaced.

It is believed that the construction and method of use of our improved heat dissipator assembly, as well as the advantages thereof, will be apparent from the foregoing detailed description. The assembly is supplied to the circuit manufacturer and it is only necessary to snap the component into the dissipator and secure the assembly on a printed circuit board in a manner previously described. The dissipator is light weight and compact in configuration yet is capable of maintaining power semiconductor components within their required temperature range.

Purely by way of example, the present dissipator may be used with the PA 264/PA 265 voltage regulator unit manufactured by General Electric Company, Electronics Park, Syracuse N. Y. This component is a monolithic high-power integrated circuit capable of up to five watts dissipation.

The maximum allowable junction temperature for this device is approximately 125° C. The general equation for determining the required heatsink efficiency is:

$$\theta_{\text{Tab-Air}} = \frac{(T_{J\,\max} - T_A) - \theta_{J\text{-Tab}} \times P_D}{P_D} \qquad (1)$$

where $T_A$ = ambient temperature $T_J$ max = maximum allowable junction temperature (125° C)

$\theta_{J\text{-}Tab}$ = thermal resistance, junction-to-tab(11° C/W)

$P_D$ = power dissipation in the IC

Maximum power dissipation is given by $P_D$ max = (Vin max - Vout min) X Iin max.

In a typical case Vin max - Vout min is approximately 8 volts and maximum input current is 0.5 amperes with a maximum ambient temperature of +75° C. Substituting in equation (1), the required heatsink efficiency is:

$$\theta_{\text{Tab-Air}} = \frac{(125-75) - 11 \times 8 \times 0.5}{8 \times 0.5}$$

$$= 1.5° \text{C/W}.$$

Our improved heatsink has a capacity to dissipate 10° C/W. It will therefore be apparent that the dissipator of the present invention has an efficiency more than adequate to maintain a typical high power semiconductor component below the maximum allowable junction temperature.

It will be apparent from the foregoing that we have provided a light weight, low cost heat dissipator for use with high power semiconductor components. Our improved dissipator may be conveniently fabricated by a simple stamping operation from a single strip of sheet metal with virtually no waste. The bending operations are preferably carried out automatically by machine on an assembly line. The attachment of the dissipator to the component is a simple manual snapping operation which dispenses with the need for screws and nuts of particular size and material, as well as torque washers and lock washers. There is less labor cost in assembling parts and in mounting them on the printed circuit board. Moreover, there is no danger of breaking or chipping the dielectric body of the component, and any shrinkage or cold flow of the component is accommodated by the resilient construction of the snap fingers.

While only one embodiment of the present invention has been specifically disclosed herein, it will be appreciated that many variations may be made therein, all within the scope of this invention as defined in the following claims.

We claim:

1. In combination, an encased semiconductor device having heat conductive L-shaped tabs extending from opposite sides of said device through said casing, said tabs having oppositely facing surfaces and a heat dissipator therefor, said heat dissipator comprising a stamped sheet metal body, means on said body and integral therewith for demountably gripping said device, and means in heat conductive relationship to said body and integral therewith in planar heat conductive engagement with at least one surface of said tabs when said device is gripped by said gripping means for conducting heat from said tabs to said metal body.

2. The heat dissipator of claim 1, said heat conductive means being correspondingly L-shaped and having substantially parallel contact surfaces adapted to engage said tabs at oppositely facing surfaces thereof in planar heat conductive relationship.

3. The heat dissipator of claim 2, wherein said gripping means comprises fingers extending from said body substantially parallel to each other and substantially perpendicular to said tab engaging surfaces of said heat conductive means.

4. The heat dissipator of claim 1, wherein said gripping means comprises resilient snap means adapted to demountably retain said casing against said body when said tabs are engaged by said L-shaped means.

5. The heat dissipator of claim 3, wherein said fingers comprise resilient snap means adapted to demountably retain said casing against said body when said tabs are engaged by said heat conductive means.

6. The heat dissipator of claim 2, wherein said body comprises a single sheet of metal, said heat conductive means and said gripping means being struck from said metal sheet and extending therefrom in a given direction.

7. The heat dissipator of claim 1, wherein said body comprises a base and two wings bent out of the plane of said base in a direction substantially opposite to said given direction.

8. The heat dissipator of claim 7, wherein said wings immediately extend from said base in a direction substantially perpendicular thereto and then diverge outwardly in opposite directions at an angle to each other.

9. The heat dissipator of claim 7, wherein said wings extend from said base first slightly convergingly and then divergingly.

10. The heat dissipator of claim 7, wherein each of said wings has narrow strips excised and displaced outwardly from the plane of said wings.

11. The heat dissipator of claim 2, further comprising two wings extending from said body in diverging relationship.

12. A heat dissipator for a semiconductor device, comprising a single stamped sheet metal body having a base, two pairs of oppositely facing fingers cut out from said sheet metal body and bent upwardly from said base, said pairs of fingers being substantially perpendicular to each other, thereby to form a cradle for said device, at least one of said pairs of fingers being adapted to demountably retain said device on said body, said sheet metal body being bent downwardly along substantially parallel lines to form two wings extending generally downwardly from said base at either side thereof in diverging relationship to each other.

13. The heat dissipator of claim 12, wherein at least one of said pairs of fingers is struck, at least in part, from said wings.

14. The heat dissipator of claim 12, wherein each of said wings has narrow strips excised and displaced outwardly from the plane of said wings.

15. The heat dissipator of claim 13, wherein each of said wings has narrow strips excised and displaced outwardly from the plane of said wings, said heat conductive means being correspondingly L-shaped and having substantially parallel contact surfaces adapted to engage said tabs at oppositely facing surfaces thereof in planar heat conductive relationship.

16. A heat dissipator for an encased semiconductor device of the type having heat conductive L-shaped tabs extended from opposite sides of said device through said casing, said tabs having oppositely facing surfaces, comprising a single stamped sheet metal body, means on said body for demountably gripping said device in heat conductive relationship to said body, correspondingly L-shaped means having substantially parallel contact surfaces adapted to engage said tabs at oppositely facing surfaces thereof in planar heat conductive relationship, said L-shaped means and said gripping means being struck from said metal sheet and extending therefrom in a given direction.

17. The heat dissipator of claim 16, wherein said gripping means comprises fingers extending from said body substantially parallel to each other and substantially perpendicular to said tab engaging surfaces of said heat conductive means.

18. The heat dissipator of claim 16, wherein said gripping means comprises resilient snap means adapted to demountably retain said casing against said body when said tabs are engaged by said L-shaped means.

19. The heat dissipator of claim 17, wherein said fingers comprise resilient snap means adapted to demountably retain said casing against said body when said tabs are engaged by said heat conductive means.

20. The heat dissipator of claim 16, wherein said body comprises a base and two wings bent out of the plane of said base in a direction substantially opposite to said given direction.

21. The heat dissipator of claim 20, wherein said wings extend immediately from said base in a direction substantially perpendicular thereto and then diverge outwardly in opposite directions at an angle to each other.

22. The heat dissipator of claim 20, wherein said wings extend from said base first slightly convergingly and then divergingly.

23. The heat dissipator of claim 20, wherein each of said wings has narrow strips excised and displaced outwardly from the plane of said wings.

24. The heat dissipator of claim 16, further comprising two wings extending from said body in diverging relationship.

* * * * *

UNITED STATES PATENT OFFICE
CERTIFICATE OF CORRECTION

Patent No. 3,670,215 Dated June 13, 1972

Inventor(s) Seymour Wilens et al.

It is certified that error appears in the above-identified patent and that said Letters Patent are hereby corrected as shown below:

On the cover sheet [72] "Seymour Wilkens" should read -- Seymour Wilens --.

Signed and sealed this 5th day of December 1972.

(SEAL)
Attest:

EDWARD M.FLETCHER,JR.
Attesting Officer

ROBERT GOTTSCHALK
Commissioner of Patents